United States Patent
Breukelaar et al.

(10) Patent No.: US 11,373,370 B1
(45) Date of Patent: Jun. 28, 2022

(54) TECHNIQUES FOR UTILIZING AN ARTIFICIAL INTELLIGENCE-GENERATED TIN IN GENERATION OF A FINAL 3D DESIGN MODEL

(71) Applicant: Bentley Systems, Incorporated, Exton, PA (US)

(72) Inventors: Ron Breukelaar, Charlotte, NC (US); Barry Mathews, Huntsville, AL (US); Gabriel Vacarasu, Stockbridge, GA (US); Peter Senft, Charlotte, NC (US); Scott Devoe, Delft (NL)

(73) Assignee: Bentley Systems, Incorporated, Exton, PA (US)

( * ) Notice: Subject to any disclaimer, the term of this patent is extended or adjusted under 35 U.S.C. 154(b) by 0 days.

(21) Appl. No.: 17/069,506

(22) Filed: Oct. 13, 2020

Related U.S. Application Data

(60) Provisional application No. 62/915,631, filed on Oct. 15, 2019.

(51) Int. Cl.
  *G06T 17/20* (2006.01)
  *G01C 7/02* (2006.01)
  *G06T 17/10* (2006.01)

(52) U.S. Cl.
  CPC ............... *G06T 17/20* (2013.01); *G01C 7/02* (2013.01); *G06T 17/10* (2013.01)

(58) Field of Classification Search
  None
  See application file for complete search history.

(56) References Cited

U.S. PATENT DOCUMENTS

| | | | | |
|---|---|---|---|---|
| 5,822,587 | A | * | 10/1998 | McDonald ............ G06F 9/4488 717/108 |
| 6,063,128 | A | * | 5/2000 | Bentley ................. G06F 9/4493 703/6 |
| 7,312,802 | B2 | | 12/2007 | Komornicki et al. |
| 7,395,191 | B2 | | 7/2008 | Detwiler et al. |

(Continued)

OTHER PUBLICATIONS

"OpenSite™ Designer CONNECT Edition," Product Data Sheet, Bentley Systems, Incorporated, Mar. 21, 2019, pp. 1-6.

(Continued)

*Primary Examiner* — Sultana M Zalalee
(74) *Attorney, Agent, or Firm* — Cesari and McKenna, LLP; James A. Blanchette

(57) ABSTRACT

In example embodiments, techniques are provided for enabling use of an AI-generated TIN in generation of a 3D design model by defining site objects (e.g., pads) using multiple (e.g., three) phases (i.e. states). A conceptual phase may be associated with a conceptual data structure, a preliminary phase may be associated with the conceptual data structure and a preliminary data structure, a final phase may be associated with the conceptual data structure, the preliminary data structure, and a final data structure. If changes are made in the conceptual phase, for example, as a result of AI optimization, they may be propagated up to the preliminary data structure and final data structure via the vertical draping. Changes made in the preliminary phase or final phase may be propagated down to the conceptual data structure by treating boundaries and breaklines as spatial constraints.

21 Claims, 6 Drawing Sheets

(56) References Cited

U.S. PATENT DOCUMENTS

| | | | |
|---|---|---|---|
| 7,639,267 B1* | 12/2009 | Desimone | G06T 15/00 |
| | | | 345/619 |
| 8,260,585 B2 | 9/2012 | Detwiler et al. | |
| 8,581,903 B2 | 11/2013 | Trotta et al. | |
| 10,255,716 B1* | 4/2019 | Godzaridis | G06T 17/20 |
| 10,360,311 B2 | 7/2019 | Detwiler et al. | |
| 10,366,180 B2 | 7/2019 | Detwiler et al. | |
| 10,614,255 B2 | 4/2020 | Detwiler et al. | |
| 10,685,166 B1* | 6/2020 | Kao | G03F 1/36 |
| 2007/0080961 A1* | 4/2007 | Inzinga | G06T 17/05 |
| | | | 345/419 |
| 2010/0088429 A1* | 4/2010 | Chu | G06F 30/00 |
| | | | 709/246 |
| 2010/0302241 A1* | 12/2010 | Reuveni | G06F 30/00 |
| | | | 345/420 |
| 2011/0060704 A1* | 3/2011 | Rubin | G06N 20/00 |
| | | | 706/12 |
| 2012/0330621 A1 | 12/2012 | Detwiler et al. | |
| 2013/0127848 A1* | 5/2013 | Joshi | G06T 17/20 |
| | | | 345/420 |
| 2013/0328872 A1* | 12/2013 | Suomi | G06T 19/00 |
| | | | 345/420 |
| 2014/0136788 A1* | 5/2014 | Faerber | G06F 17/30315 |
| | | | 711/133 |
| 2014/0250108 A1* | 9/2014 | Mogilicherla | G06F 16/00 |
| | | | 707/723 |
| 2016/0313982 A1* | 10/2016 | Jensen | G06F 3/0482 |
| 2017/0329875 A1* | 11/2017 | Detwiler | G06Q 10/06 |
| 2018/0114368 A1* | 4/2018 | Marketsmueller | G06T 17/10 |
| 2019/0080520 A1* | 3/2019 | Godzaridis | G06T 15/30 |

OTHER PUBLICATIONS

Uy, Phyllis T., "Creating 3D Models Using ArcGIS™," Rev C, Z Corporation, Oct. 2003, pp. 1-13.

Watson, Carl, et al., "Improving Geological and Process Model Integration Through TIN to 3D Grid Conversion," Elsevier Ltd., Computers & Geosciences, vol. 82, Sep. 2015, pp. 45-54.

* cited by examiner

TECHNIQUES FOR UTILIZING AN ARTIFICIAL INTELLIGENCE-GENERATED TIN IN GENERATION OF A FINAL 3D DESIGN MODEL

RELATED APPLICATION

The present application claims the benefit of U.S. Provisional Patent Application No. 62/915,631 by Ron Breukelaar et al., filed on Oct. 15, 2019, titled "TECHNIQUES FOR UTILIZING AN ARTIFICIAL INTELLIGENCE-GENERATED TIN IN GENERATION OF A FINAL 3D DESIGN MODEL", the contents of which are incorporated by reference herein in their entirety.

BACKGROUND

Technical Field

The present disclosure relates generally to civil engineering, and more specifically to techniques for utilizing an artificial intelligence (AI)-generated triangulated irregular network (TIN) in generation of a 3D design model.

Background Information

A variety of software applications have been developed to assist in the planning and development of commercial, mixed use and residential land sites, including features such as parking lots, building footprints, sidewalks, and the like. Among other functions, such software may utilize AI to optimize a grading plan for the site. Typically, a site is divided into a number of site objects. One example of a site object is a pad. A "pad" refers to an area of similar surface conditions (material, depth, run off min/max slope etc.). Examples of pads include an island, the paved surface of a parking lot, the paved surface of a driveway, a sidewalk, a building slab, a dumpster slab, etc. Pads may be is stand alone, or may nest inside of each other. Any transition from one surface type to another surface type typically happens at the edges of a pad. As such, other site structures such as curbs, retaining walls, etc., are typically defined on the edge of a pad.

A site object, such as a pad, is typically associated with spatial constraints (e.g., maximum slope, minimum elevation, height of wall, etc.). To permit AI optimization of a grading plan for a site having a number of site objects (e.g., pads), it is common to represent site objects (e.g., pads) with a TIN. Data describing each point in the TIN may be associated with data describing the triangles that include that point, and vice versa, enabling the TIN to be traversed rapidly. AI optimization may utilize an evolutionary algorithm (e.g., a genetic algorithm) to find more feasible and cheaper grading plans over the course of many (e.g., thousands) of iterations, adjusting the elevation of points in the TIN over each iteration. The evolution may be guided by a metric that considers the spatial constraints of site objects, with adjustments that exceed the spatial constraints penalized in the metric, and adjustments that decrease required work and materials (and thereby cost) rewarded in the metric.

In order for AI optimization (e.g., using an evolutionary algorithm) to have a sufficient opportunity to find an optimal grading plan, the number of triangles in the TIN typically needs to be quite large. The more triangles, the more different ways a surface can be bent and the closer it can be conformed to an optimal shape. While a TIN with a large number of triangles is desirable for AI optimization of a grading plan, this poses a problem if the TIN is to be used in a detailed 3D design model in a later stage of the planning and development of the site. To make even small changes the user may be required to manually edit the elevations of a huge number of points of the triangles of the TIN. This task may be exceedingly tedious and counterintuitive, essentially preventing a user from manually "tweaking" a 3D design model that uses the TIN.

To avoid this tedious and counterintuitive task, a traditional workflow in the planning and development of sites is to perform AI optimization to generate an optimized TIN, and then use that information from that optimized TIN as a guide in the manual creation of a 3D design model. The 3D design model is laboriously created "from scratch" by a user using design modeling tools. In addition to being highly inefficient, such workflow hinders iterative refinement. If any changes are made that would affect the grading plan and require more optimization, with a traditional workflow, the user would discard the 3D design model, perform AI optimization on the updated grading plan to generate a new optimized TIN, and then use information from that new optimized TIN as a guide in the manual creation of a new 3D design model for the site, again "from scratch." Given the burden of rerunning optimization with this sort of traditional workflow, it may be avoided and optimal grading may not be obtained.

Accordingly, there is a need for improved techniques for utilizing an AI-generated TIN in generation of a 3D design model that may address some or all of these shortcomings.

SUMMARY

In example embodiments, techniques are provided for enabling use of an AI-generated TIN in generation of a 3D design model by defining site objects (e.g., pads) using multiple (e.g., three) phases (i.e. states). Each phase has an associated data structure, creating a layered data structure. A conceptual phase is associated with a conceptual data structure, which includes a conceptual TIN and spatial constraints. A preliminary phase is associated with the conceptual data structure and a preliminary data structure that includes boundaries defined by at least one profile (e.g., an inner profile, an outer profile, or both), breaklines, and a preliminary TIN. A final phase is associated with the conceptual data structure, the preliminary data structure, and a final data structure that defines a 3D design model and includes explicit transitions from one surface to another (e.g., curbs) and surface templates.

The boundaries and breaklines of the preliminary data structure and final data structure depend via vertical draping on the conceptual data structure, the nature of the dependency regulated by a drape property. If changes are made in the conceptual phase, for example, as a result of AI optimization, they may be propagated up to the preliminary data structure and final data structure of the other phases via the vertical draping.

Changes made in the preliminary phase or final phase may be propagated down to the conceptual data structure by treating boundaries and breaklines as spatial constraints. In such manner, the tedious and counterintuitive task of manually editing a TIN later in the planning and development workflow, and the laborious task of creating a 3D design model "from scratch" may be avoided, producing a more efficient workflow.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which:

FIG. 4 is a diagram illustrating draping for a portion of the site of FIG. 3, including portions of the parking lot, an island and tie-in;

DETAILED DESCRIPTION

Figure 1:
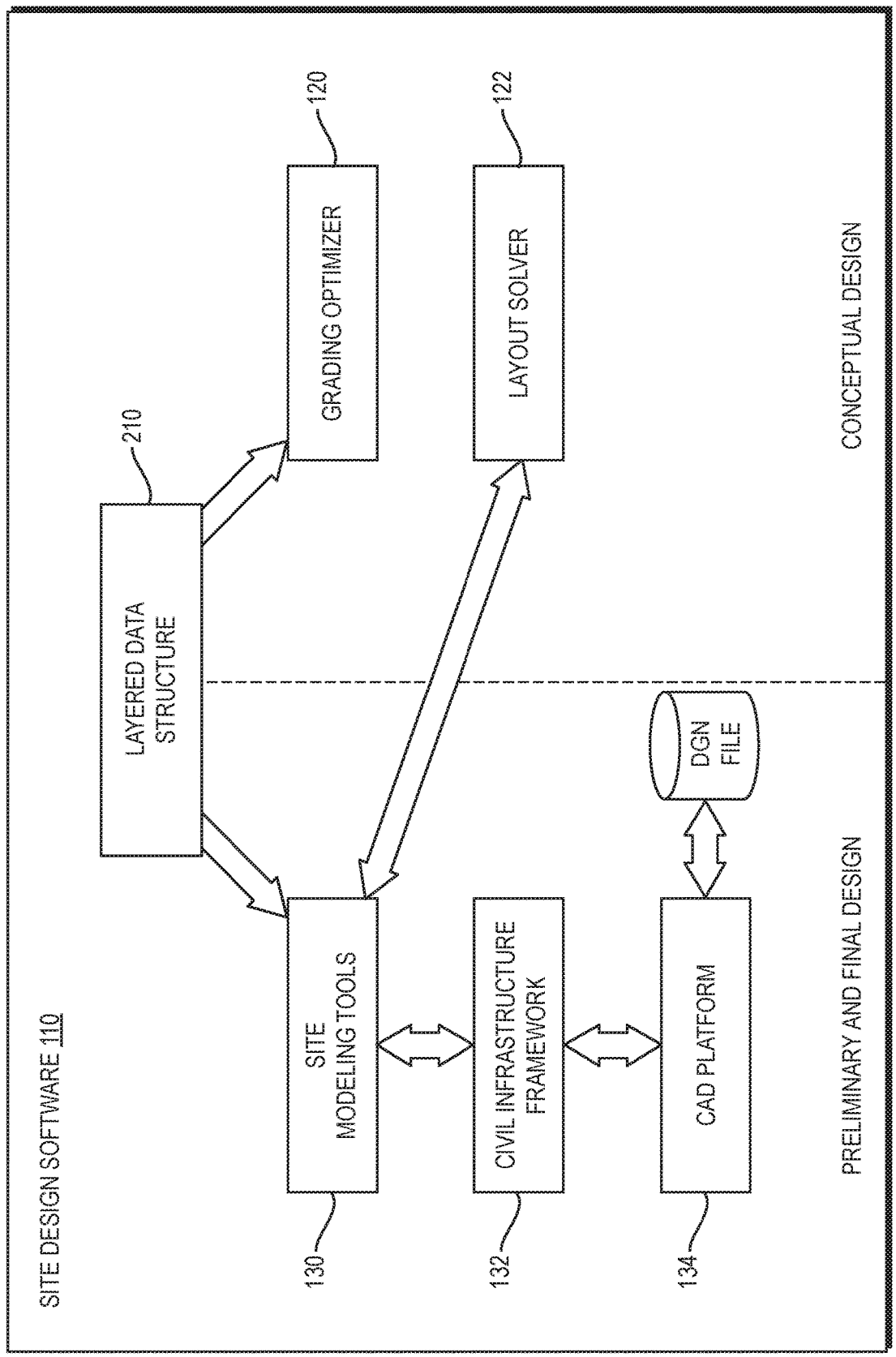
FIG. 1 is a high-level block diagram of an example software architecture in which the techniques may be implemented.

FIG. 1 is a high-level block diagram of an example software architecture in which the techniques may be implemented. The software architecture includes site design software 110 that may be executed on one or more computing devices (including processors, memory, other hardware components) local to an end-user and/or on one or more computing devices remote from the end-user (e.g., in the cloud) accessible via a network (e.g., the Internet). In one embodiment, the site design software 110 is the OpenSite™ Designer application, available from Bentley Systems, Incorporated. The site design software 110 may include software tools tailored to different types of design for a commercial, mixed use or residential land site. The types of design may include conceptual design in which initial 2D layout questions are addressed (such as "does it fit"), preliminary design in which more detail is added, including 3D aspects, and final design in which a detailed 3D design model is produced from which construction documents can be generated.

To facilitate conceptual design, the site design software 110 may include a grading optimizer 120 and a layout solver 122. The layout solver 122 generates conceptual layouts of 2D objects, while the grading optimizer optimizes 3D elevation (grading) of those objects. The grading may be represented in a TIN and such optimization typically includes an AI optimization using an evolutionary algorithm (e.g., a genetic algorithm), adjusting the elevation of points in the TIN over iterations. The evolution is typically guided by a metric that considers spatial constraints.

To facilitate preliminary and final design, the site design software 110 may include site modeling tools 130, a civil infrastructure framework (CIF) 132 and a computer aided design (CAD) platform 134. The CAD platform 134 supports basic CAD drawing and object creation (e.g., lines, arcs, meshes, solids, etc.), storing such objects in database files (e.g., DGN files). In one embodiment, the CAD platform 134 is the Microstation® platform, available from Bentley Systems, Incorporated. The CIF 132 allows for more complex object creation and provides a rule engine that resolves dependencies between objects. The site modeling tools 130 utilize the functionality of both the CAD platform 134 and the CIF 132, and in some cases the layout solver 122, to create and/or update a detailed 3D design model, in response to user input in a user interface.

A layered data structure 210 may functionally link conceptual, preliminary and final design in the site design software 110. As described below, the layered data structure 210 may enable use of an AI-generated TIN in generating a 3D design model by defining site objects (e.g., pads) using multiple (e.g., three) phases (i.e. states).

Figure 2:
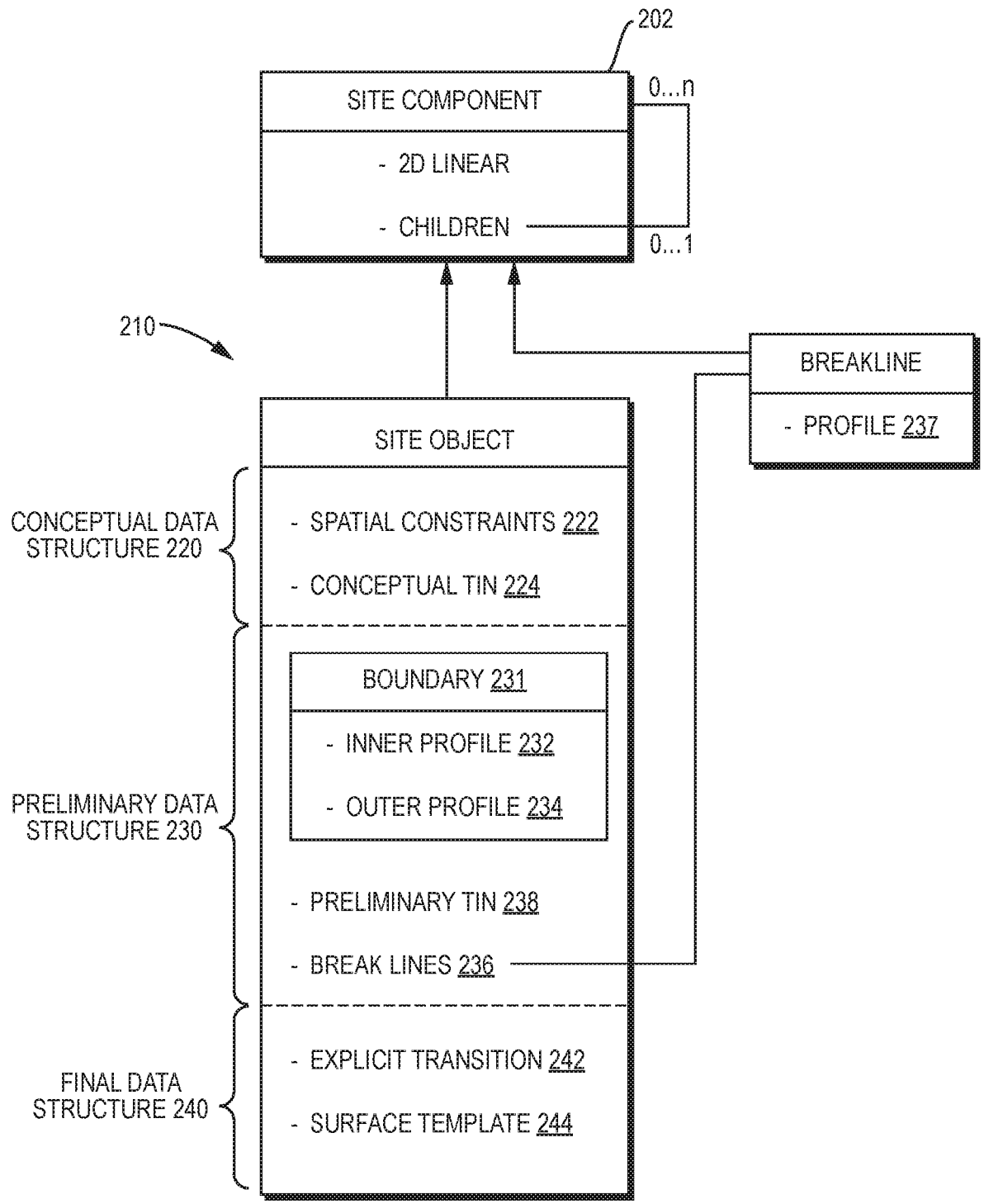
FIG. 2 is a block diagram illustrating an example layered data structure.

FIG. 2 is a block diagram illustrating an example layered data structure 210. For purposes of illustration, a pad is repeatedly used in the description below as an example of a site object that can be represented by the layered data structure 210. However, it should be understood that the layered data structures 210 can represent a variety of other site objects.

A class for the layered data structure 210 may inherit from a generic site component class 202 that includes a description of nesting ability and a listing of children. The layered data structure 210 includes a conceptual data structure 220, a preliminary data structure 230 and a final data structure 240. A conceptual phase (i.e. state) is defined by the conceptual data structure 220. A preliminary phase (i.e. state) is defined by a combination of the conceptual data structure 220 and the preliminary data structure 230. Likewise, a final phase (i.e. state) is defined by a combination of the final data structure 240, preliminary data structure 230 and conceptual data structure 220.

The conceptual data structure 220 includes a conceptual TIN 222 and spatial constraints 224 that are produced directly by the grading optimizer 120 for the site object (e.g., pad). The conceptual TIN 222 is part of a tree (not shown) having a number of nodes that each represent site objects (e.g., pads) that are related by parent-child relationships. Each node includes a boundary and a list of optimized triangles. A root of the tree defines a property boundary (sometimes referred to as a "limit of disturbance") for the site as a whole. A site object (e.g., pad) is a child of another site object (e.g., pad) if the boundary of the site object is inside the boundary of the other site object. If there are no site objects (e.g., pads) that fully encompass a site object, the site object is a direct child of the property boundary defined by the root. A boundary may be defined by a 2D shape and an elevation. The 2D shape may be represented as a closed 2D polygon that may include lines, circles and arcs. The elevation may be defined as a profile that starts and ends at a same location along the closed 2D polygon and extends around its perimeter. The list of optimized triangles includes triangles that cover the entre area inside the boundary, except for any gaps created by child site objects (e.g., child pads). The gaps are connected to the triangle of child site objects (e.g., child pads) with vertical triangles referred to as "walls". A wall can be of a fixed elevation or of a linear transitioning elevation.

The spatial constraints 224 of the conceptual data structure 220 may include a number of constraints (e.g., maximum slope, minimum elevation, height of wall, etc.) for the site object (e.g., pad) that were defined by a user or are propagated down to the conceptual data structure 220 from the preliminary and final phases, as discussed in more detail below.

Figure 3:
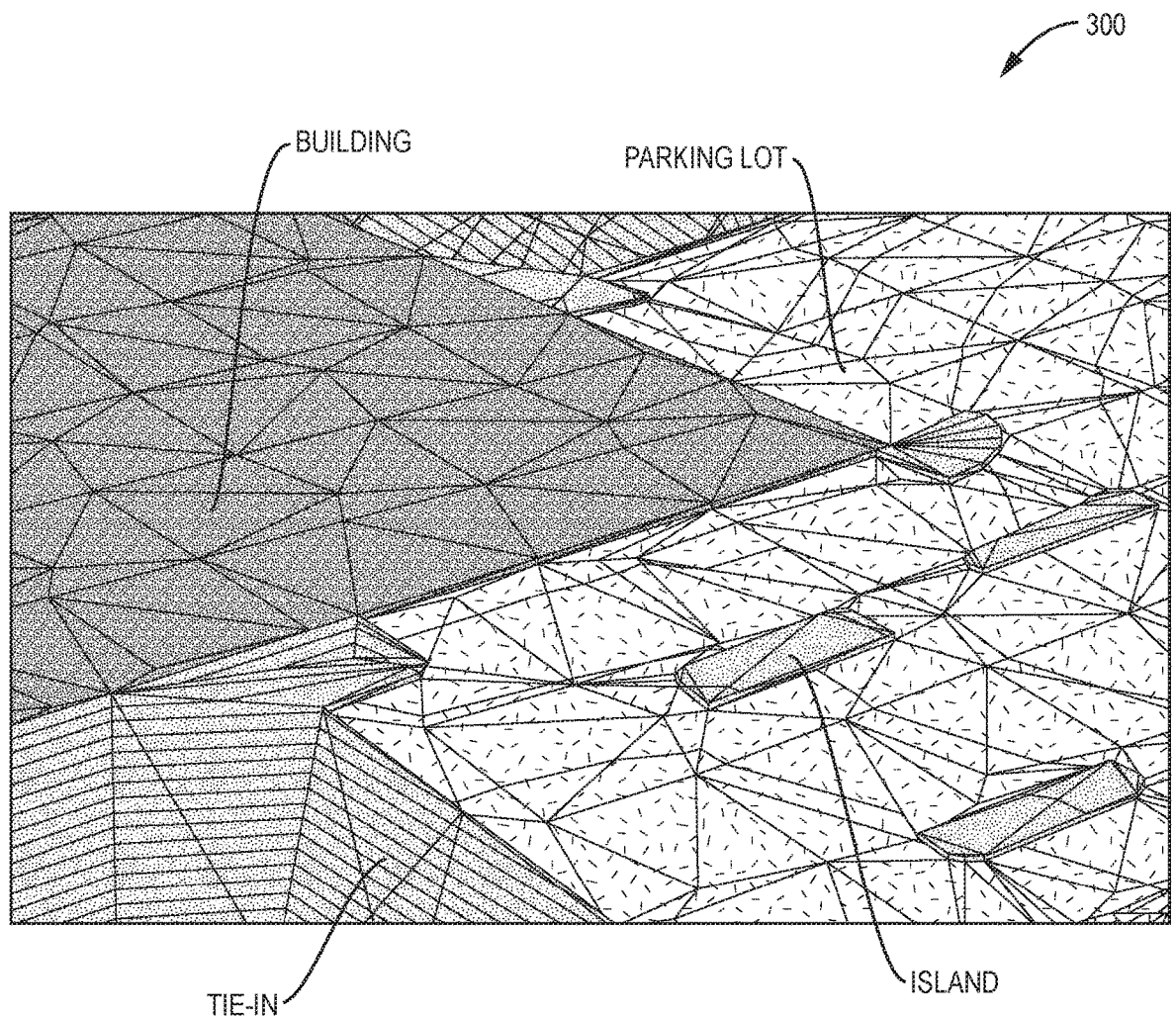
FIG. 3 is a view of an example conceptual surface generated for the conceptual phase, which may be shown in a user interface of site design software.

FIG. 3 is a view 300 of an example conceptual surface generated for the conceptual phase, which may be shown in a user interface of the site design software 110. The view 300 shows a number of site objects (e.g., pads) that define different features of the site, including a building, parking lot, islands, and tie-in area. As a result of AI optimization of the grading optimizer 120, in this example, the TIN representing the building and parking lot includes a large number of triangles.

The preliminary data structure 220 includes boundaries 231 defined by at least one profile (e.g., an inner profile 232, an outer profile 234 or both), breaklines 236 defined by profiles 237, and in some cases a preliminary TIN 238 for the site object (e.g., pad). The boundaries 231 are defined by an inner profile 232 that describers the elevation at the edge on the surface of the site object (e.g., pad). The boundaries 231 may optionally be defined by an outer profile 234 if the site object (e.g., pad) has a parent, that defines the elevation at the edge on surface of the parent. If there is a wall at the boundary, the difference between the elevation of the inner profile and the outer profile defines the height of the wall. The breaklines 236 are defined by profiles 237 of lines that divide the triangles of the surface structure inside a site object (e.g., pad). In contrast to a boundary, a breakline 236 may be defined by a profile 237 that is a non-closed polygon, and that does not have to start and end at the same elevation.

The profiles 232, 234, 237 of the boundaries 231 and breaklines 236 may depend via vertical draping on the conceptual data structure 220. To that end, boundaries 231 and breaklines 236 may include a drape property that describes the nature of the dependency The drape property may have one of three values: "Optimized", "Draped on Parent" and "User Defined". When the drape property is set to "Optimized", the profile depends on the conceptual surface generated for the site object (e.g., pad) using the conceptual data structure 220. This may be the default drape property. When the drape property is set to "Drape on Parent", the profile depends on the profile of a preliminary surface of the parent of the site object (e.g., pad) generated using the preliminary data structure 220 and an optional elevation difference for this site object (e.g., pad) and its parent from the conceptual surface generated using the conceptual data structure 220. When the drape property is set to "User Defined", the profile depends upon user input to the site modeling tools 130.

Users can change the value of the drape property which changes the dependency on the conceptual data structure 220. If the drape property is set to "Optimized" or "Drape on Parent", the profile is updated each time changes are made in the conceptual phase, for example, as a result of AI optimization by the grading optimizer 120. If the drape property is set to "User Defined", changes made in the preliminary phase, for example, as a result of user input in the site modeling tools 130, are propagated down to the conceptual phase as spatial constraints 222.

Figure 4:
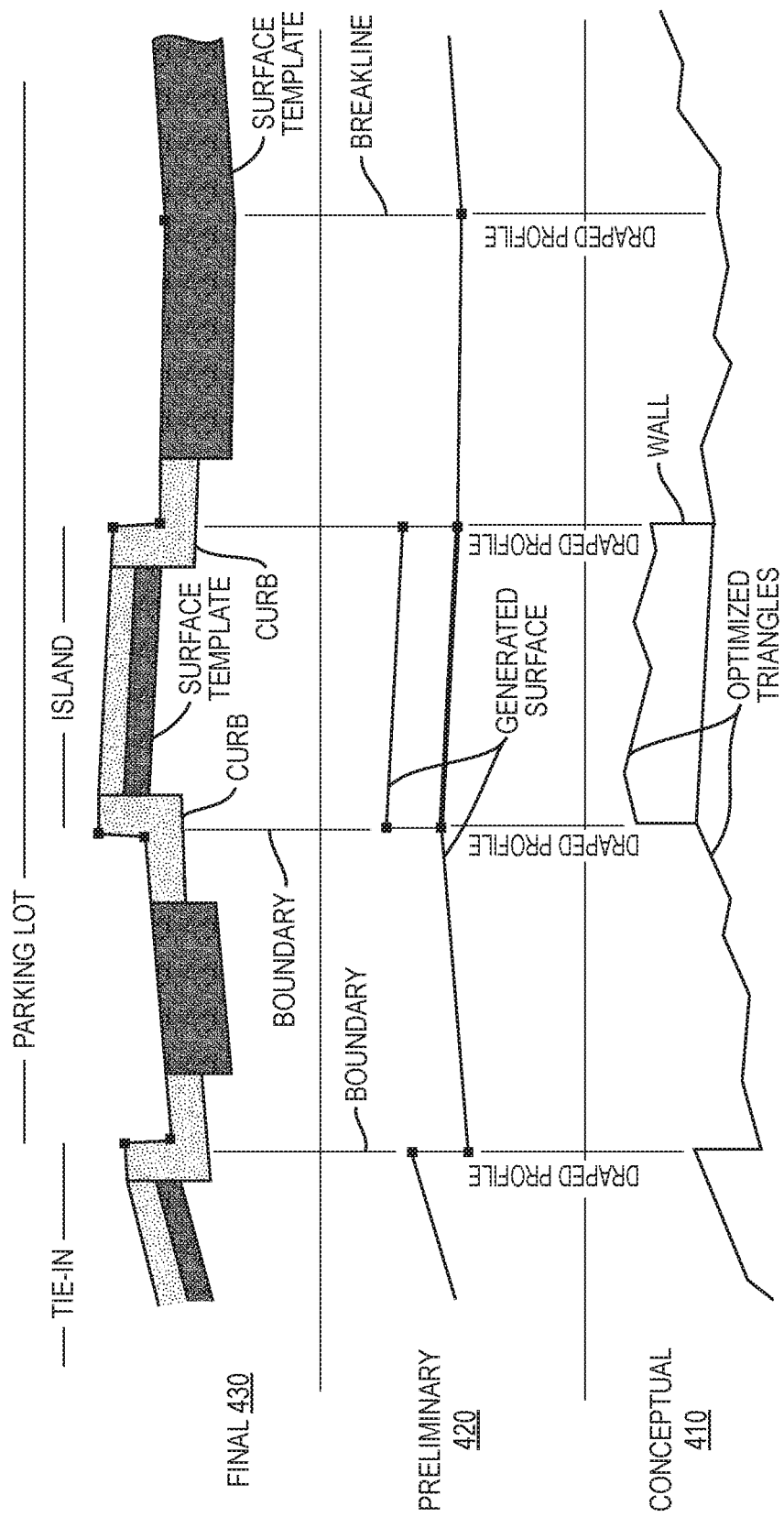

FIG. 4 is a diagram illustrating draping for a portion of the site of FIG. 3, including portions of the parking lot, the island and tie-in. A conceptual surface 410 is shown composed of optimized triangles (including walls) from the conceptual data structure 220. To generate the preliminary surface 420, profiles 232, 234 at boundaries and breaklines are defined based using the conceptual data.

Figure 5:
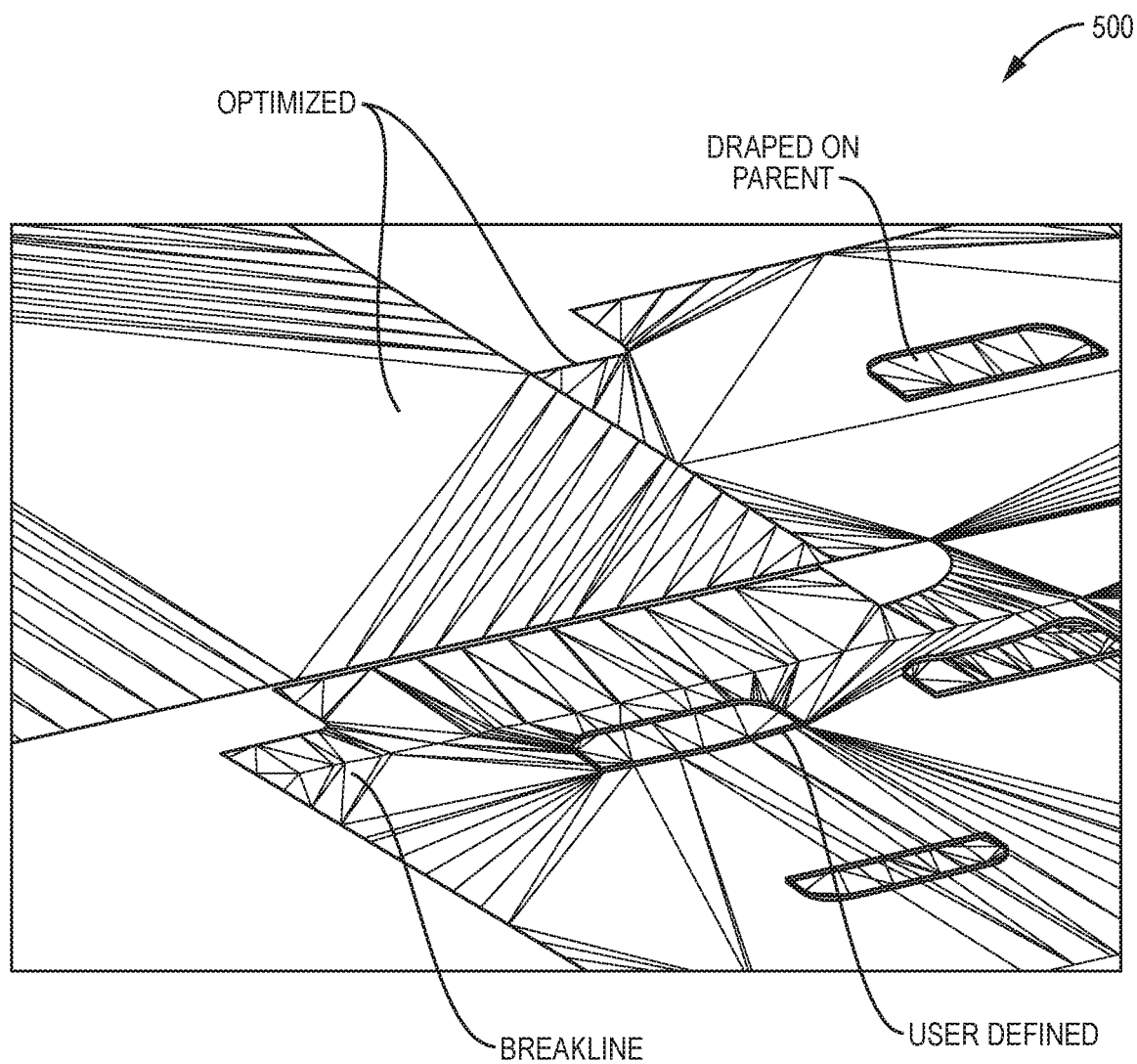
FIG. 5 is a view of an example preliminary surface generated for the preliminary phase, which may be shown in a user interface of the design software.

FIG. 5 is a view 500 of an example preliminary surface generated for the preliminary phase, which may be shown in a user interface of the site design software 110. The preliminary surface of a site object (e.g., pad) is defined by its boundaries 231, breaklines 236 and any child site objects (e.g., pads) with boundaries that have a drape property that is not set to "Draped on Parent". The boundaries 231 and the inner profile 232 act as the outside of triangles. The breaklines 236 divide the triangles to help define a skeleton description of an otherwise too complex surface. The child site objects (e.g., child pads) are cut out of the preliminary surface any time their elevation is not dependent on a parent. If the drape property of a child site object (e.g., child pad) is set to "Optimized", the child site object has its profile(s) defined based upon the conceptual data structure 220 and if the drape property is set to "User Defined" the profile(s) depend on input to the site modeling tools 130 used for the preliminary stage. If the drape property of a child site object (e.g., child pad) is set to "Drape on Parent", the elevation of the parent is used to update the profile(s) of the child site object.

The final data structure 230 of the final stage defines a 3D design model and includes explicit transitions 242 from one surface to another (e.g., curbs) and surface templates 244 that provide depth and layer information. An explicit transition 242 (e.g., curb) is defined using a 3D cross section definition that is applied at intervals along the boundary of a site object (e.g., pad). Explicit transitions 242 (e.g., curbs) are not applied everywhere in the 3D design model and only certain changes are provided an explicit transition 242 (e.g., curb). A surface template is a list of thickness that are applied on top of a surface and generate textured meshes that have volumes. A surface template may be used to create the appearance of grass, topsoil, asphalt with different levels of aggregate, concrete or other applied materials. It can be used to determine required work and materials used, and thereby can be a basis for a cost estimate.

Figure 6:
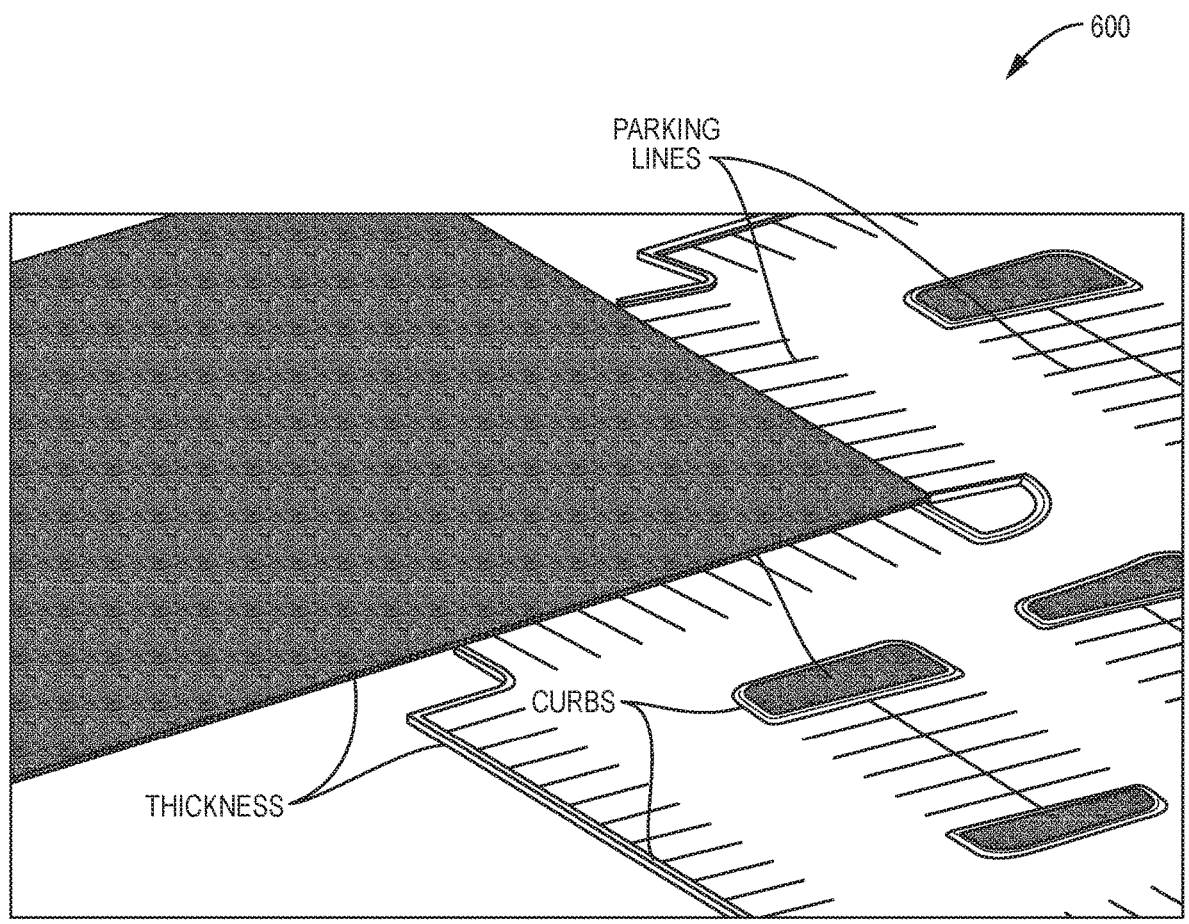
FIG. 6 is a view of an example final surface generated for the final phase, which may be shown in a user interface of the site design software.

FIG. 6 is a view 600 of an example final surface generated for the final phase, which may be shown in a user interface of the site design software 110. The final surface of site objects (e.g., pads) are surrounded by transitions (e.g., curb) and covered by textured surfaces. Markings (e.g., parking lines) may be draped on the final surface to improve visual appearance of the 3D design model.

It should be understood that a wide variety of adaptations and modifications may be made to the techniques. Further, in general, functionality may be implemented in software, hardware or various combinations thereof. Software implementations may include electronic device-executable instructions (e.g., computer-executable instructions) stored in a non-transitory electronic device-readable medium (e.g., a non-transitory computer-readable medium), such as a volatile memory, a persistent storage device, or other tangible medium. Hardware implementations may include logic circuits, application specific integrated circuits, and/or other types of hardware components. Further, combined software/hardware implementations may include both electronic device-executable instructions stored in a non-transitory electronic device-readable medium, as well as one or more hardware components. Above all, it should be understood that the above description is meant to be taken only by way of example.

What is claimed is:
1. A method comprising:
generating, by a grading optimizer executing on one or more computing devices, a triangulated irregular network (TIN) including a site object of a site;
maintaining the TIN in a layered data structure that represents the site object using multiple phases, the multiple phases including a conceptual phase associated with a conceptual data structure that maintains the TIN, a preliminary phase associated with the conceptual data structure and a preliminary data structure, and a final phase associated with the conceptual data struc- ture, the preliminary data structure, and a final data structure that maintains a three-dimensional (3D) design model including the site object;

receiving one or more changes to the TIN from the grading optimizer;

in response to the one or more changes to the TIN from the grading optimizer, propagating the one or more changes to the TIN up to the preliminary data structure and final data structure via vertical draping;

receiving one or more changes to the 3D design model from site modeling tools executing on the one or more computing devices; and in response to the one or more changes to the 3D design model from the site modeling tools, propagating the one or more changes to the 3D design model down to the TIN of the conceptual data structure.

2. The method of claim 1, wherein the propagating the one or more changes to the TIN up to the preliminary data structure and final data structure comprises:

defining a profile of a boundary based upon a conceptual surface generated for the site object using the TIN via the vertical draping.

3. The method of claim 1, wherein the propagating the one or more changes to the 3D design model down to the TIN comprises:

treating boundaries and breaklines as spatial constraints for the grading optimizer in generating the TIN.

4. The method of claim 1, wherein the grading optimizer generates the TIN using artificial intelligence (AI) grading optimization.

5. The method of claim 1, wherein the conceptual data structure includes spatial constraints.

6. The method of claim 1, wherein the preliminary data structure includes boundaries defined by at least one profile and breaklines.

7. The method of claim 1, wherein the final data structure includes explicit transitions from one surface to another and surface templates.

8. The method of claim 7, wherein the site object is a pad and the explicit transitions are curbs.

9. A computing device, comprising:

a processor; and a memory coupled to the processor and configured to store site design software that is executable on the processor, the site design software including:

a grading optimizer configured to generate a triangulated irregular network (TIN) including a site object of a site, site modeling tools configured to produce a three-dimensional (3D) design model including the site object based on the TIN, and a layered data structure configured to maintain the TIN and the 3D design model using multiple phases, the multiple phases including at least a conceptual phase associated with a conceptual data structure that maintains the TIN, and a final phase associated with at least the conceptual data structure and a final data structure that maintains the 3D design model, wherein changes to the TIN by operation of the grading optimizer are propagated up to the 3D design model via the layered data structure by vertical draping, and changes to the 3D design model by operation of the site modeling tools are propagated down to the TIN via the layered data structure as spatial constraints.

10. The computing device of claim 9, wherein the multiple phases further include a preliminary phase associated with the conceptual data structure and a preliminary data structure.

11. The computing device of claim 9, wherein changes to the TIN by operation of the grading optimizer are propagated up to the 3D design model via the layered data structure by defining a profile of a boundary based upon a conceptual surface generated for the site object using the TIN via the vertical draping.

12. The computing device of claim 9, wherein changes to the 3D design model by operation of the site modeling tools are propagated down to the TIN via the layered data structure by treating boundaries and breaklines as spatial constraints for the grading optimizer.

13. The computing device of claim 9, wherein the site object is a pad.

14. A non-transitory electronic device readable medium having instructions that when executed on one or more processors of one or more electronic devices are operable to:

generate a triangulated irregular network (TIN) including a site object of a site;

maintain the TIN in a layered data structure that represents the site object using multiple phases, the multiple phases including at least a conceptual phase associated with a conceptual data structure that maintains the TIN, and a final phase associated with at least the conceptual data structure and a final data structure that maintains a three-dimensional (3D) design model of the site object;

receive one or more changes to the TIN;

in response to the one or more changes to the TIN, propagate the one or more changes to the TIN up to the 3D design model of the final data structure via vertical draping;

define a profile of a boundary based upon a conceptual surface generated for the site object using the TIN via the vertical draping;

receive one or more changes to the 3D design model; and in response to the one or more changes to the 3D design model, propagate the one or more changes to the 3D design model down to the TIN of the conceptual data structure.

15. The non-transitory electronic device readable medium of claim 14 wherein the multiple phases further include a preliminary phase associated with the conceptual data structure and a preliminary data structure.

16. The non-transitory electronic device readable medium of claim 14, further comprising instructions that when executed are operable to:

treat boundaries and breaklines as spatial constraints in generating the TIN.

17. The non-transitory electronic device readable medium of claim 14, further comprising instructions that when executed are operable to:

use artificial intelligence (AI) grading optimization in generation of the TIN.

18. The non-transitory electronic device readable medium of claim 14, wherein the multiple phases further include a preliminary phase associated with the conceptual data structure and a preliminary data structure, and the preliminary data structure includes boundaries defined by at least one profile and breaklines.

19. The non-transitory electronic device readable medium of claim 14, wherein the final data structure includes explicit transitions from one surface to another and surface templates.

20. A method comprising:

generating, by software executing on one or more computing devices, a triangulated irregular network (TIN) including a site object of a site;

maintaining the TIN in a layered data structure that represents the site object using multiple phases, the multiple phases including at least a conceptual phase associated with a conceptual data structure that maintains the TIN, and a final phase associated with at least a final data structure that maintains a three-dimensional (3D) design model of the site object;

receiving one or more changes to the TIN from the software;

in response to the one or more changes to the TIN, propagating the one or more changes to the TIN up to the 3D design model of the final data structure via vertical draping.

21. The method of claim 20, further comprising:

receiving one or more changes to the 3D design model from the software or additional software executing on the one or more computing devices; and in response to the one or more changes to the 3D design model, propagating the one or more changes to the 3D design model down to the TIN of the conceptual data structure as spatial constraints.

\* \* \* \* \*

UNITED STATES PATENT AND TRADEMARK OFFICE
CERTIFICATE OF CORRECTION

| | | |
|---|---|---|
| PATENT NO. | : 11,373,370 B1 | Page 1 of 1 |
| APPLICATION NO. | : 17/069506 | |
| DATED | : June 28, 2022 | |
| INVENTOR(S) | : Ron Breukelaar et al. | |

It is certified that error appears in the above-identified patent and that said Letters Patent is hereby corrected as shown below:

In the Specification

Column 1, Line 38:
"building slab, a dumpster slab, etc. Pads may be is stand"
Should Read:
--building slab, a dumpster slab, etc. Pads may be stand--

Signed and Sealed this
Twentieth Day of May, 2025

Coke Morgan Stewart
*Acting Director of the United States Patent and Trademark Office*